(12) United States Patent
Eichmeyer et al.

(10) Patent No.: US 11,593,201 B2
(45) Date of Patent: Feb. 28, 2023

(54) MEMORY APPARATUS WITH REDUNDANCY ARRAY

(71) Applicant: Micron Technology, Inc., Boise, ID (US)

(72) Inventors: Seth Eichmeyer, Boise, ID (US); James Rehmeyer, Boise, ID (US); Benjamin Johnson, Boise, ID (US); Jason Johnson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 583 days.

(21) Appl. No.: 16/685,766

(22) Filed: Nov. 15, 2019

(65) Prior Publication Data

US 2020/0081782 A1  Mar. 12, 2020

Related U.S. Application Data

(63) Continuation of application No. 15/498,071, filed on Apr. 26, 2017, now Pat. No. 10,514,983.

(51) Int. Cl.

| G06F 11/10 | (2006.01) |
| G11C 29/52 | (2006.01) |
| G11C 29/00 | (2006.01) |
| G11C 29/42 | (2006.01) |
| G11C 29/44 | (2006.01) |
| G11C 29/08 | (2006.01) |
| G11C 29/04 | (2006.01) |

(52) U.S. Cl.
CPC ...... *G06F 11/1076* (2013.01); *G06F 11/1048* (2013.01); *G11C 29/42* (2013.01); *G11C 29/44* (2013.01); *G11C 29/52* (2013.01); *G11C 29/76* (2013.01); *G11C 29/08* (2013.01); *G11C 2029/0411* (2013.01)

(58) Field of Classification Search
CPC ............ G06F 11/1048; G06F 11/1068; G06F 11/1076; G11C 29/42; G11C 29/48; G11C 29/52; G11C 29/76; G11C 29/78
See application file for complete search history.

(56) References Cited

U.S. PATENT DOCUMENTS

| 5,781,483 A | * | 7/1998 | Shore | G11C 29/781 |
| | | | | 365/230.06 |
| 2005/0041491 A1 | * | 2/2005 | Kyung | G11C 29/785 |
| | | | | 365/200 |

(Continued)

*Primary Examiner* — Shelly A Chase
(74) *Attorney, Agent, or Firm* — Dorsey & Whitney LLP (57) ABSTRACT

Apparatuses and methods for memory repair for a memory device are described. An example apparatus includes: a data input/output circuit that provides data via a plurality of data signal lines; memory cell arrays; an ECC/Parity redundancy array; and a redundancy circuit coupled to the plurality of data signal lines. The redundancy circuit includes an error correction block that generates error correction information based on the data and provides the error correction information to the ECC/Parity redundancy array. If during test it is determined that a failure is not repairable by standard redundancy including error correction code, the error correction parity array is not needed and can be redirected by a block repair circuit. The error correction circuit can now have its functionality changed to allow the error correction array to become a block repair.

18 Claims, 6 Drawing Sheets

(56) References Cited

U.S. PATENT DOCUMENTS

| | | |
|---|---|---|
| 2006/0218467 A1 | 9/2006 | Sibigtroth et al. |
| 2010/0077132 A1 | 3/2010 | Hung |
| 2014/0380117 A1* | 12/2014 | Hirano ................. G11C 29/702 |
| | | 714/758 |
| 2016/0246679 A1 | 8/2016 | Kim |
| 2018/0314595 A1 | 11/2018 | Eichmeyer et al. |

* cited by examiner

MEMORY APPARATUS WITH REDUNDANCY ARRAY

CROSS-REFERENCE TO RELATED APPLICATION(S)

This application is a continuation of U.S. patent application Ser. No. 15/498,071, filed Apr. 26, 2017, issued as U.S. Pat. No. 10,514,983 on Dec. 24, 2019. This application and patent are incorporated by reference herein, in their entirety, and for any purposes.

BACKGROUND

In a semiconductor memory device, memory cells may be susceptible to errors based on a transient error, soft error or combination. Transient errors may be caused by noise from surrounding components, operating conditions, or operating slightly out of specification. Transient errors may also be caused by defects, part design, or degradation.

For example, memories have been developed that include error detection and/or error correcting codes (ECC) to correct these errors. In a write operation, check data may be written by setting a plurality of sets of 8-bit data to a memory cell array. In a read operation, read data of the plurality of sets are compared with data in a register on the 8-bit unit basis. If there merely is a 1-bit mismatch in the read data, the mismatch may still be detected as an error and the detected one bit error leads to a fail result of the read data in this configuration. Thus, the ECC is effective in detecting a few bit (e.g., 1, 2) errors in the memory cell array, even after a manufacturing and testing process. ECC gives the ability to correct specific bit based defect signatures that are scattered throughout the memory array. This ECC does not work on larger localized defect signatures.

The semiconductor memory device may execute methods to correct defects detected in the memory array. These defects are usually caused by transient errors. For example, memories have been developed that include, redundant rows, redundant columns, and redundant blocks. These redundant elements allow defects not to impact standard operation of the memory device. During testing a defect could cause a bit fail, a single row fail or a single column fail. Once these fails are identified, the address for that fail is stored in a non-volatile memory (e.g. anti-fuses, or other non-volatile memory array). During standard operation the address for the single row or single column fail overrides the internal addressing of the part so the defect is not addressed and the redundant row or column corresponding with the address in the non-volatile array is accessed instead. This effectively corrects the defect. Due to space considerations of the non-volatile array, defects that require multiple redundant rows or redundant columns in a localized area can be addressed by a single block repair. The block repair occupies less space in the non-volatile memory array, but due to the number of redundant physical bits required for the block repair, it is not a very efficient repair.

Thus, the ECC may be effective when the array contains few bit errors, the errors are not detectable at test, or when the errors are generated by transient defects. Standards methods of repair allow for column and row repair when a defect has been identified at test. For larger defects, a block repair would be useful but due to then number of physical bits required is usually inefficient. On dice that are not repairable because of a large defect causing the need for a block repair when there is not one available, the ECC redundant bits could be used as a block repair.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
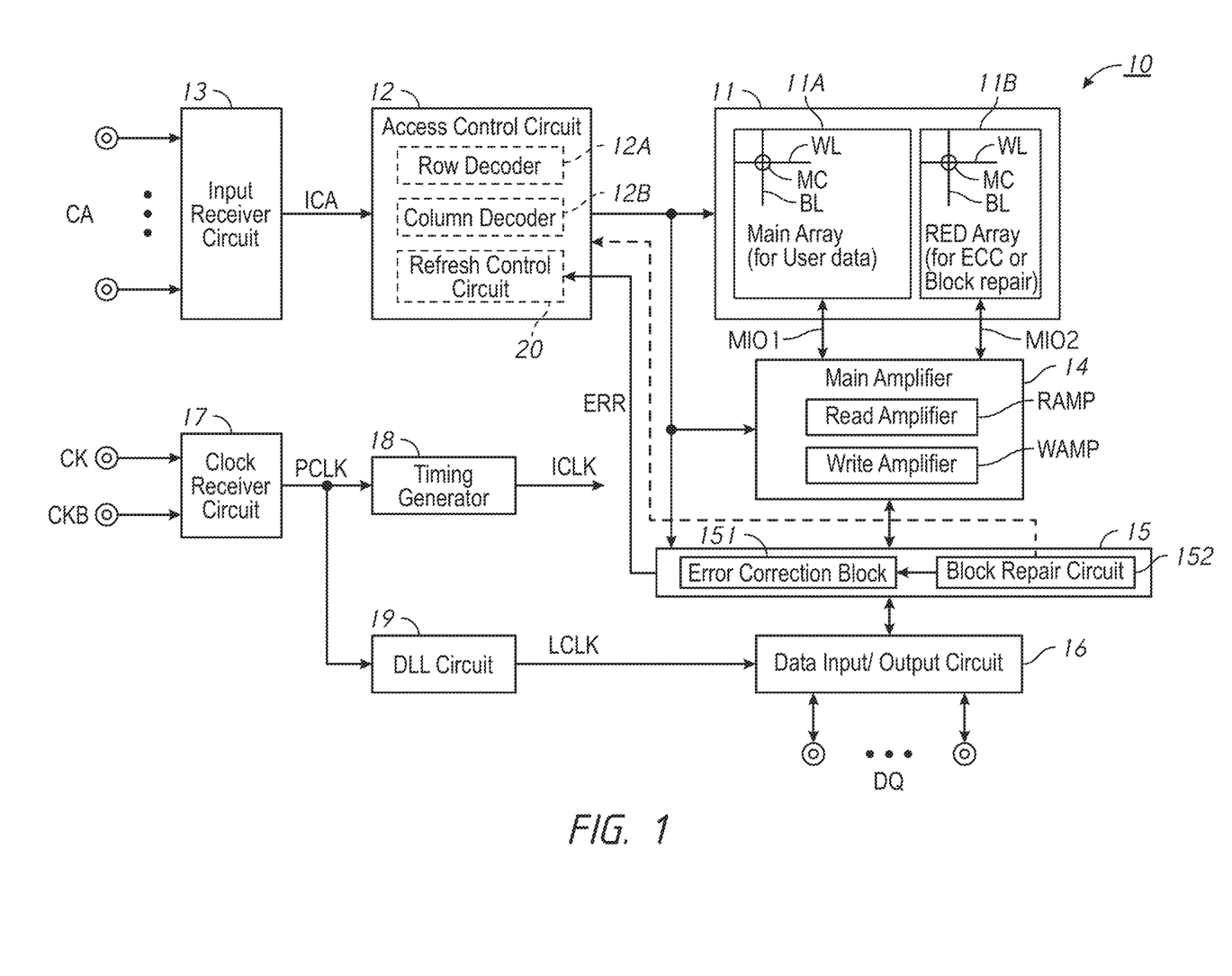
FIG. 1 is a block diagram of a semiconductor memory device including an ECC Parity/redundancy array in accordance with an embodiment of the present disclosure.

FIG. 1 is a block diagram of a semiconductor device 10 according to one embodiment of the present invention. For example, the semiconductor device 10 may be a wide variety of semiconductor memories, including, for example, Dynamic Random Access Memories (DRAMs) and Static RAMs (SRAMs). The semiconductor device 10 includes a memory cell array unit 11 that may store data. The memory cell array unit 11 may include a main array 11a that can store user data and an ECC Parity/redundancy (ECC/RED) array 11b that may store redundancy data. For example, the redundancy data may be error correction information for ECC, which is verification data (e.g., syndrome, etc.), or redundancy data due to block repair. Thus, the ECC Parity/redundancy array 11b may be used by a plurality of memory redundancy systems. Each of the arrays 11a and 11b may include a plurality of word lines WL, a plurality of bit lines BL, and a plurality of memory cells MC arranged at intersections of the word lines WL and the bit lines BL. The plurality of memory cells MC in the main array 11a may store each bit of the user data, and the plurality of memory cells MC in the ECC Parity/redundancy array 11b may store each bit of the redundancy data.

The semiconductor device 10 may include an input receiver 13 that may provide an internal command address signal ICA based on an external command address signal CA. For example, the input receiver 13 may include a command decoding circuit (not shown). The semiconductor device 10 may include an access control circuit 12 for handling memory cell access in the memory cell array unit 11. The access control circuit 12 may control operations of various circuit blocks included in the semiconductor device 10, based on the internal command address signal ICA. For example, the access control circuit 12 may include a row decoder 12a, a column decoder 12b, and a refresh control circuit 20. The row decoder 12a may provide the memory cell access in a row direction by activating a word line WL, while the column decoder 12b may provide the memory cell access in a column direction by activating a bit line BL. The refresh control circuit 20 may provide control timing of refreshing operations of the memory cells MC.

The memory cell arrays 11a and 11b may be coupled to a main amplifier 14, as one of the bit lines BL is activated. For example, the memory cell array 11a may be coupled to the main amplifier 14 via main data lines MIO1, whereas the memory cell array 11b may be coupled to the main amplifier 14 via main data lines MIO2. The main amplifier 14 may include a read amplifier RAMP and a write amplifier WAMP. The read amplifier RAMP may be activated at execution of a read operation, to amplify the user data and the redundancy data read from the memory cell array 11a and the memory cell array 11b via the main data lines MIO1 and the main data lines MIO2, respectively. The write amplifier WAMP may be activated at execution of a write operation, to write user data and redundancy data to the memory cell array 11a and the memory cell array 11b via the main data lines MIO1 and the main data lines MIO2, respectively.

The main amplifier 14 may be coupled to a redundancy circuit 15. The redundancy circuit 15 may include a plurality of redundancy preventive systems. For example, the plurality of redundancy preventive systems may include an error correction (ECC) block 151 and a block repair circuit 152, which will be described in detail later in this disclosure. For example, defective memory cells in the main array 11a may be detected in a test mode and/or depending on a number of the defective memory cells in each block (e.g., an array). If the number of the defective memory cells is beyond error correction capability of the ECC block, the block repair circuit 152 may be activated, which disables the ECC block 151. On the other hand, the block repair circuit 152 is disabled and the ECC block 151 is enabled, if the number of the defective memory cells is within the error correction capability of the ECC block.

The redundancy circuit 15 may be coupled to a data input/output circuit 16. At execution of the read operation, the data input/output circuit 16 may provide user data to data terminals DQ of the semiconductor device 10 that provide data output signals. At execution of the write operation, the data input/output circuit 16 may receive user data from the data terminals DQ that receive data input signals. The data input/output circuit 16 may provide the received user data to the redundancy circuit 15.

The semiconductor device 10 may include a clock receiver circuit 17 that may receive complementary external clock signals CK and CKB and provide an internal clock signal PCLK. The internal clock signal PCLK may be provided to a timing generator 18 and to a DLL circuit 19. The timing generator 18 may generate an internal clock signal ICLK, based on the internal clock signal PCLK. The internal clock signal ICLK may be provided to various circuits including the access control circuit 12 and the main amplifier 14. The DLL circuit 19 may provide a phase-controlled output clock signal LCLK, based on the internal clock signal PCLK. The output clock signal LCLK may be provided to the data input/output circuit 16, where timing of providing outputting user data from the data input/output circuit 16 to the data terminals DQ is based on the output clock signal LCLK.

Figure 2:
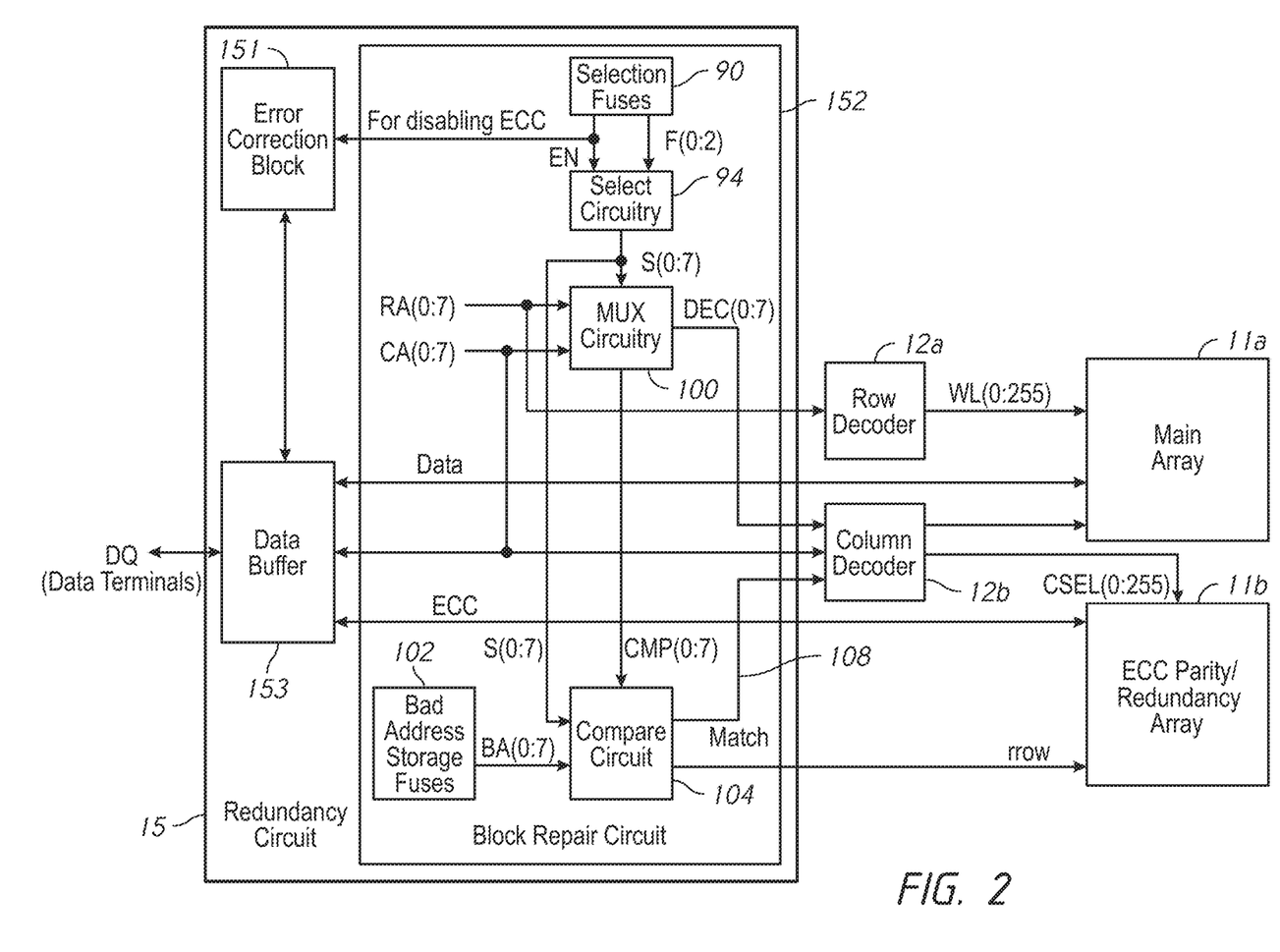
FIG. 2 is a block diagram of a redundancy circuit and a redundancy array included in a semiconductor memory device in accordance with an embodiment of the present disclosure.

FIG. 2 is a block diagram a redundancy circuit 15 and an ECC Parity/redundancy array 11b in the semiconductor device 10 in accordance with an embodiment of the present disclosure. The redundancy circuit 15 may include an ECC correction block 151, a block repair circuit 152 and a data buffer 153.

For example, the block repair circuit 152 may execute a block repair function to redirect data designated to a block in one main array 11A that includes a plurality of defective cells among the main arrays 11A to another block among the main arrays 11A and the ECC Parity/redundancy array 11B. For example, the block may be an array and the data designated to the block may be redirected to another block in another array different from the array of the block. For example, the block may be a subsection of the array, and the block may be redirected to another block in the same array or another block in another array different from the same array. For example, the other array may be a redundancy array, or an adjacent array. The block repair circuit 152 may include a fuse circuit (e.g., selection fuses) 90. For example, the selection fuses 90 may be any non-volatile element (e.g., fuses, anti-fuses, or flash EEPROM cells). The selection fuses 90 may be programmed to provide signals regarding a "block repair configuration," including a control signal (e.g., a block repair enable signal EN), and fuse signals F(0:2), to select circuitry 94. The block repair enable signal EN may be programmed based on a scope of repair, such as whether a block repair is applied (e.g. a number of defective cells in a block is beyond error correction capability of the ECC correction block 151 and the block repair is selected instead of ECC). The block repair function within a main array 11a using a selected redundant row within the ECC Parity/redundancy array 11b may be enabled, responsive to an active state of the block repair enable signal EN. Responsive to an inactive state of the block repair enable signal EN, the error correction function by the error correction block 151 using the ECC Parity/redundancy array 11b may be enabled and the block repair function within the main array 11a using the selected redundant row within the ECC Parity/redundancy array 11b may be disabled. While the block repair function is active within the main array 11a, a status of the fuse signals F(0:2) may determine dimensions of a block to be repaired.

For example, upon receiving the block repair enable signal EN and the fuse signals F(0:2), the select circuitry 94 may provide selection signals S(0:7) to mux circuitry 100. The selection signals S(0:7) may determine a number of rows of the repair block. The mux circuitry 100 may provide compare signals CMP(0:7), which are the most significant bits of the row address RA(0:7) in accordance with the selection signals S(0:7). For example, with the selection signals S(0:7) all set to zero, the repair block may have a single row and all bits of the row address RA(0:7) are passed through as the compare signals CMP(0:7) to a compare circuit 104. For example, if the selection signals S(0:7) are set to fifteen, then the repair block may have sixteen rows and the four most significant bits of the row address RA(0:7) are passed through as the compare signals CMP(0:7) the mux circuitry 100. For example, if the selection signals S(0:7) are set to two-hundred fifty-five, then the repair block may include two-hundred fifty-six rows.

A portion of the address of a defective memory cell within the main array 11a may be stored using bad address storage fuses 102. For example, the selection fuses 90 may be any non-volatile element (e.g., fuses, anti-fuses, or flash EEPROM cells). The bad address storage fuses 102 may provide a bad address BA(0:7) to the compare circuit 104. For example, if the repair block has sixteen rows to be used to repair the defective cell, then the bad address storage fuses 102 are programmed in a manner that a portion of the bad address (e.g., BA7-BA4) match the portion of the row address of the defective cell, and another portion of the bad address (e.g., BA3-BA0) match another portion of the column address of the defective cell. If the repair block used to repair the defective cell is an entire column within the main array 11a, then none of the bad address storage fuses 102 are programmed with bits from the row address of the defective memory cell. Instead, the bad address storage fuses 102 are programmed with the column address of the defective memory cell, which will be described in detail later in this disclosure.

The compare circuit 104 may receive the compare signals CMP(0:7) from the mux circuitry 100, and compare any portion of the compare signals CMP(0:7) with any corresponding portion of the bad address BA(0:7) that includes bits of the row address of the defective memory cell. If a match occurs, the compare circuit 104 may enable an access operation (e.g. fire) with a redundant row (now) within the ECC Parity/redundancy array 11b. In the meanwhile, the row address RA(0:7) may cause a row decoder 106 associated with the main array 96 to fire a selected one of two-hundred fifty-six rows WL(0:255) in the main array 11a. Thus, the redundant row in the ECC Parity/redundancy array 11b and the row in the main array 11a are fired responsive to the row address RA(0:7) when the match occurs.

A column address CA(0:7) determines whether data access (e.g., read, write) will occur with the main array 11a or the ECC Parity/redundancy array 11b, based on the match result from the compare circuit 104. The mux circuitry 100 may receive the column address CA(0:7), and update the compare signals CMP(0:7) and a redundant decode address DEC(0:7) to reflect the received column address CA(0:7). Upon receiving the updated compare signals CMP(0:7), the compare circuit 104 compares the updated compare signals CMP(0:7) to the bad address BA(0:7). When the match occurs, the compare circuit 104 may activate a match signal 108 that causes the column decoder 12b to activate a column based on the redundant decode address DEC (0:7) from the mux circuitry 100 that is a column address of a redundant cell in the redundancy array, associated with a column address of the defective cell in the main array 11a and data access between the data buffer and the ECC Parity/redundancy array 11b may be enabled. When the match does not occur, the compare circuit 104 may provide an inactive match signal to the column decoder 12b to cause the column decoder 12b to activate a column based on the column address CA(0:7). Thus, the column decoder 12b may enable data access between the data buffer 153 and the main array 11a in accordance with the column address CA(0:7).

As earlier mentioned, the block repair circuit 152 is disabled and the error correction function by the error correction block 151 using the ECC Parity/redundancy array 11b may be enabled, responsive to the inactive state of the block repair enable signal EN. Responsive to the active state of the block repair enable signal EN, an error correction function by the error correction block 151 using the ECC Parity/redundancy array 11b may be disabled. The ECC correction block 151 may execute error detection and/or error correcting codes to detect and correct errors, if the number of the defective memory cells in each array is within error correction capability of the ECC correction block 151 (e.g., one or two cells). For example, the ECC correction block 151 may receive data from the data terminal DQ via the data buffer 153 and compute error correction information ECC (e.g., syndrome) in a write operation. The error correction block may provide error correction information ECC to the data buffer 153. The data buffer 153 may provide the error correction information ECC to the ECC Parity/redundancy array 11b while providing the data to the main array 11a.

For example, the error correction block 151 may perform verification of the data by while receiving the data from the main array 11a and the error correction information ECC from the ECC Parity/redundancy array 11b via the data buffer 153 during the read operation. The error correction block 151 may execute error detection to detect errors. The error correction block 151 may correct the data, if any error is detected, and if the number of the defective memory cells in each array is within error correction capability of the error correction block 151 (e.g., one or two cells), the error correction block 151 may provide the corrected data to the data terminals DQ via the data buffer 153. The error correction block 151 may indicate the data contains errors, if a number of errors detected is beyond error correction capability of the error correction block 151. If there is no error, the error correction block 151 may indicate that error correction block 151 does not detect an error in the data and the data buffer 153 may provide the data from the main array 11a to the data terminals DQ.

Figure 3A:
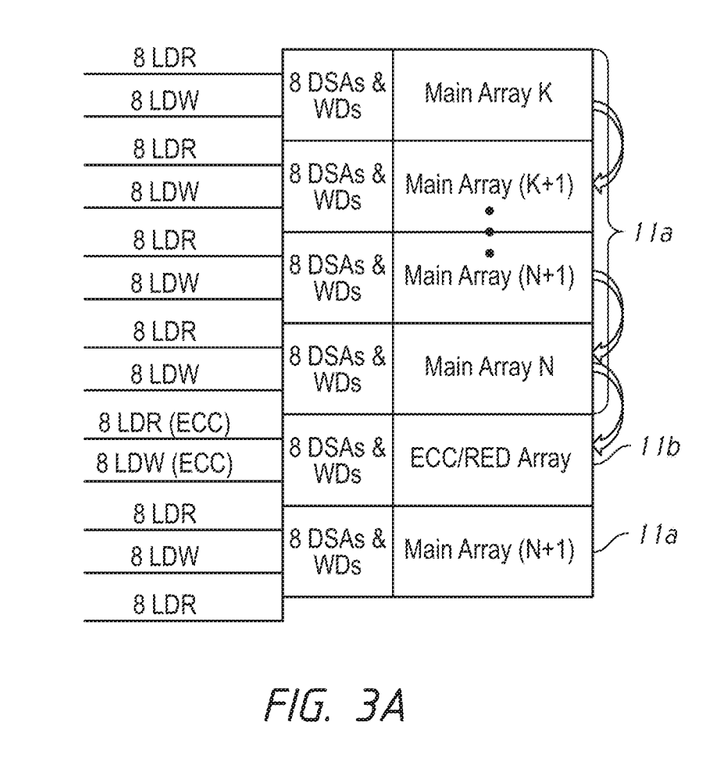
FIGS. 3A to 3D are schematic diagrams of main arrays and a redundancy array included in a semiconductor memory device in accordance with an embodiment of the present disclosure.
Figure 3B:
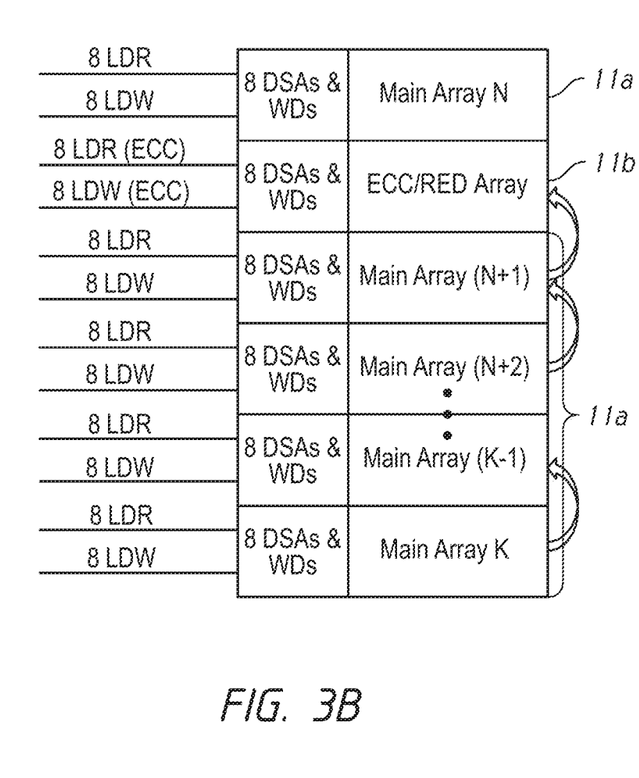
Figure 3C:
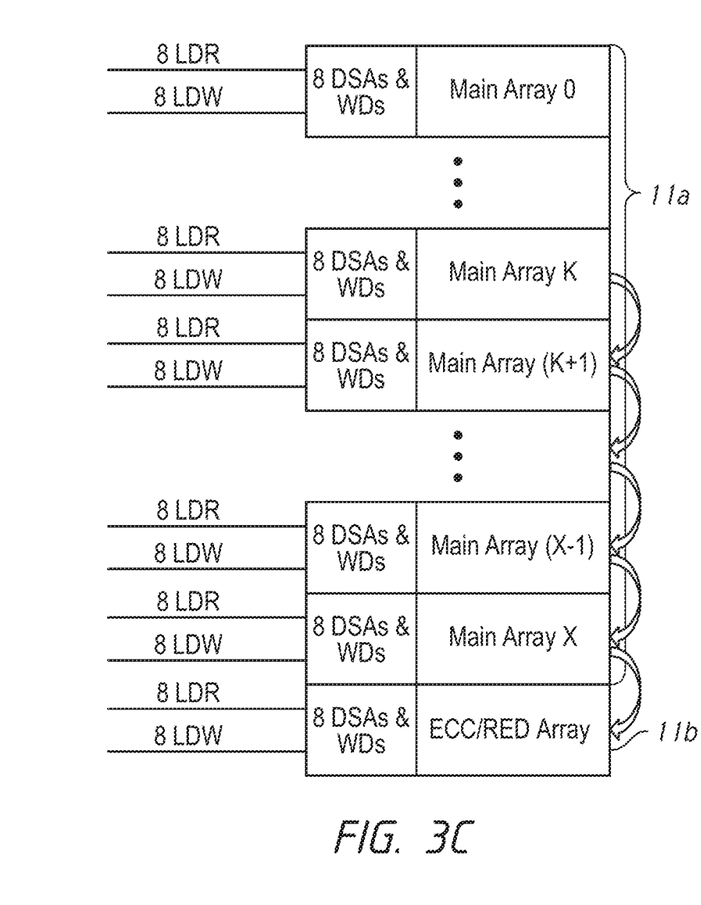
Figure 3D:
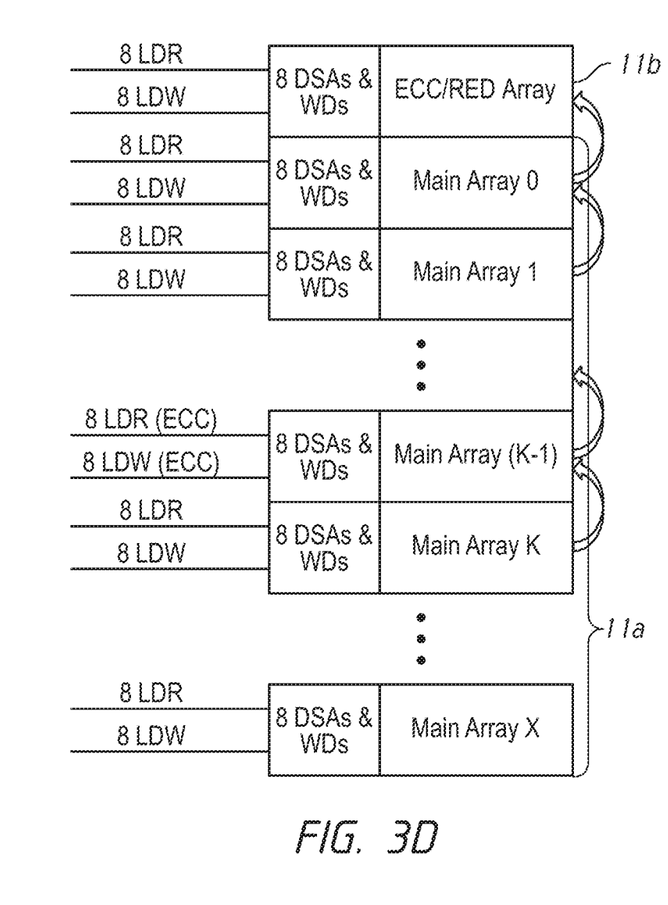

In some embodiments, a block, such as a block in Main Array K (K is a natural number) may contain a plurality of defective cells. Data designated to Main Array K and data designated to main arrays 11a between Main Array K and the ECC Parity/redundancy array 11b may be directed to an adjacent array in a direction towards the ECC Parity/redundancy array 11b. FIGS. 3A-3D are schematic diagrams of main arrays and a redundancy array included in a semiconductor memory device in accordance with an embodiment of the present disclosure. A direction of shift may be designed accordingly to an arrangement of the ECC Parity/redundancy array 11b along with the main arrays 11a and a location of the defective array. For example, the ECC Parity/redundancy array 11b may be located between Main Array N and Main Array (N+1) (where N is a natural number). As shown in FIG. 3A, a block repair for Main Array K (where K is a natural number) including a plurality of defective memory cells may cause redirection of data addressed Main Array K–Main Array (N−1) to Main Array (K+1)–Main Array N and redirection of data addressed Main Array N to the ECC Parity/redundancy array 11b, if K is smaller than or equal to N. As shown in FIG. 3B, a block repair for Main Array K including a plurality of defective memory cells may cause redirection of data addressed Main Array (N+2)–Main Array K to Main Array (N+1)–Main Array (K−1) and redirection of data addressed Main Array (N+1) to the ECC Parity/redundancy array 11b, if K is equal to or greater than (N+1). For example, the ECC Parity/redundancy array 11b may be located adjacent to Main Array X (where X is a number of Main Arrays) as shown in FIG. 3C, and a block repair for Main Array K including a plurality of defective memory cells may cause redirection of data addressed Main Array K–Main Array (X−1) to Main Arrays (K+1)–X and data addressed Main Array X may be redirected to the ECC Parity/redundancy array 11b. For example, the ECC Parity/redundancy array 11b may be located adjacent to Main Array 0 as shown in FIG. 3D, and a block repair for Main Array K including a plurality of defective memory cells may cause redirection of data addressed Main Array 1–Main Array K to Main Arrays 0–Main Array (K−1) and data addressed Main Array 0 may be redirected to the ECC Parity/redundancy array 11b.

Figure 4:
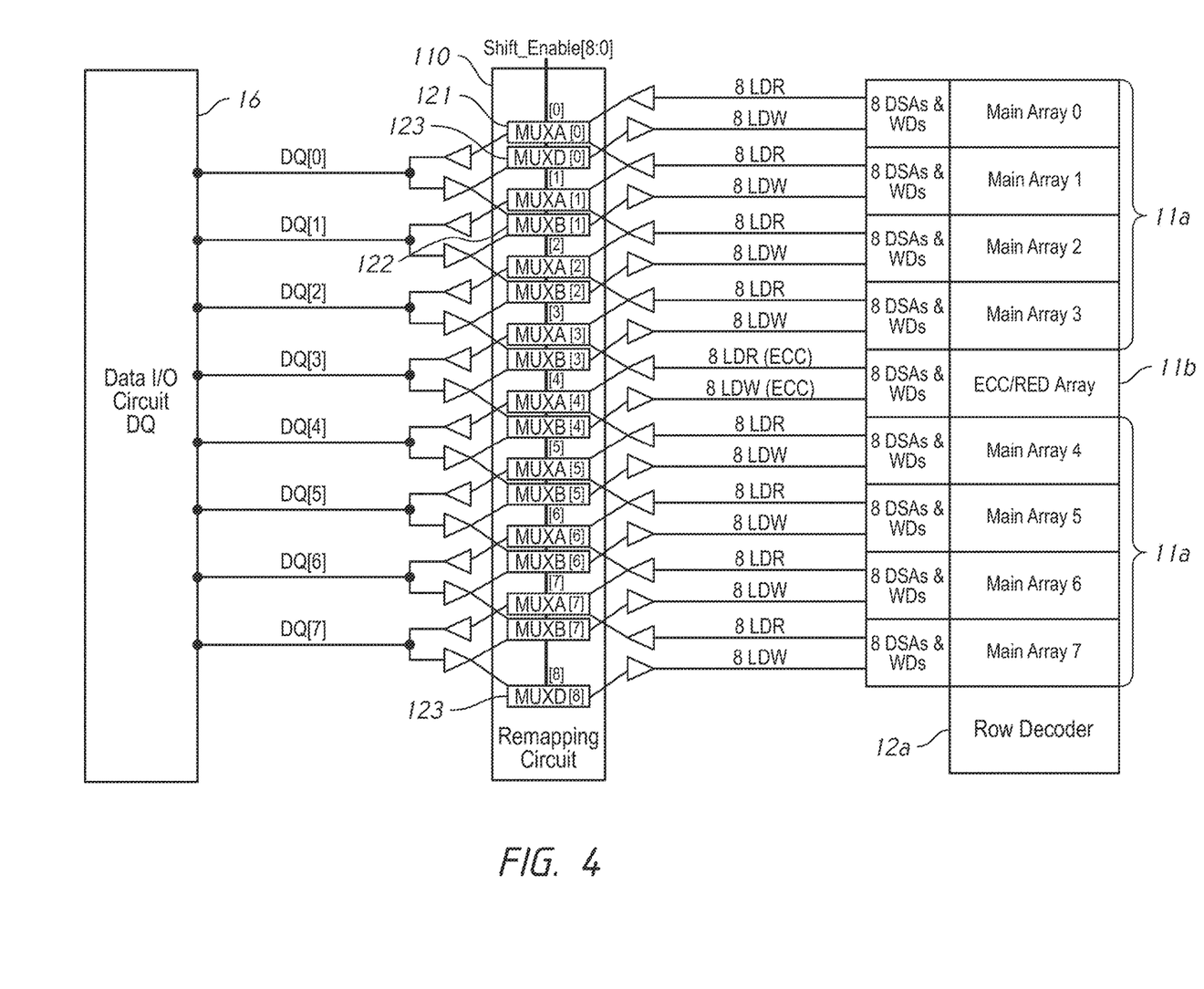
FIG. 4 is a block diagram of a remapping circuit coupled to main arrays and a redundancy array in a semiconductor memory device in accordance with an embodiment of the present disclosure.

In some embodiments, a plurality of multiplexers corresponding to each array may redirect data designated to an array to an adjacent array (e.g., column plane). For example, FIG. 4 is a block diagram of a remapping circuit 110 coupled to main arrays 11a and an ECC Parity/redundancy array 11b in a semiconductor memory device in accordance with an embodiment of the present disclosure. Word lines of each array of the main arrays 11a and the ECC Parity/redundancy array 11b may be coupled to a plurality of word drivers (e.g., 8 WDs) coupled to a row decoder 12a. Each of the plurality of word drivers may activate a corresponding word line in response to an output of the row decoder 12a. Each array of the main arrays 11a and the ECC Parity/redundancy array 11b may be coupled to a plurality of data sense amplifiers (e.g., 8 DSAs) for sensing data from memory cells in each array. To store (e.g., write) data into memory cells, the remapping circuit 110 may provide data from data terminals to each array of the main arrays 11a and the ECC Parity/redundancy array 11b via a plurality of local data buses for writing (e.g., 8 LDWs). To retrieve (e.g., read) data from the memory cells, the remapping circuit 110 may provide data from each array of the main arrays 11a and the ECC Parity/redundancy array 11b via a plurality of local data buses for reading (e.g., 8 LDRs).

For example, the remapping circuit 110 may be included in the data buffer 153 in FIG. 2. For example, the remapping circuit 110 may be included in the MUX circuitry 100. For example, the remapping circuit 110 may include a plurality of multiplexers MUXA 121, a plurality of multiplexers MUXB 122, and a plurality of dummy multiplexers MUXD 123. For example, the plurality of multiplexers MUXA 121 may be provided for routing data to be from one of two adjacent arrays of to the main arrays 11a and the redundancy arrays 11b to a data input/output (IO) circuit 16. For example, the plurality of multiplexers MUXB 122 may be provided for routing data to be written from the data input/output (IO) circuit 16 to the main arrays 11a and the redundancy arrays 11b. For example, the dummy multiplexers 110 may receive one signal instead of two signals and may further equalize respective loads of driver circuits (not shown) for regulating signal transmissions. Thus, the plurality of multiplexers MUXA 121 and MUXB 122 may couple the data I/O circuit 16 to the main arrays 11a and the redundancy arrays 11b. In FIG. 4, the ECC Parity/redundancy array 11b may be located between the main array 11a (Main Array 3) and the main array 11a (Main Array 4), however, the ECC Parity/redundancy array 11b may be located anywhere adjacent to at least one main array 11a. In this example, the remapping circuit 110 may receive shift control signals Shift_Enable [8:0]. Shift_Enable [8:0] signals may be indicative if rerouting occurs to each of the main arrays 11a and 11b due to shift (e.g., using an adjacent array) by disabling a defective array and enabling the ECC Parity/redundancy array 11b. For example, Shift_Enable [0:3] signals may correspond to the main arrays 0-3 11a respectively, Shift_Enable [4] signal may correspond the ECC Parity/redundancy array 11b, and Shift_Enable [5:8] signals may correspond to the main arrays 4-7 11a. For example, Shift_Enable [8:0] signals may be provided based on the fuse signals F(0:2) that may indicate the defective array by the selection fuses 90 or based on the bad address BA(0:7) in the defective array by the bad address storage fuses 102.

For example, Shift_Enable [0] signal may be provided to the multiplexer MUXA[0] 121 and the dummy multiplexer MUXD[0] 123. If the Shift_Enable [0] signal is not active (e.g., a logic low level), which is indicative that the main array 11a (Main Array 0) is in use, a multiplexer MUXA[0] 121 and a dummy multiplexer MUXD[0] 123 may couple the main array 11a (Main Array 0) to a data signal line DQ[0]. The multiplexer MUXA[0] 121 and the dummy multiplexer MUXD[0] 123 may decouple the main array 11a (Main Array 0) from the data signal line DQ[0], if the Shift_Enable [0] signal is active (e.g., a logic high level), which is indicative that the main array 11a (Main Array 0) has been disabled due to block error. The data from/to the data signal line DQ[0] may not be coupled to the main array 11a (Main Array 0), and the data from/to DQ[0] may be redirected to an adjacent main array 11a (Main Array 1), instead of the ECC Parity/redundancy array 11b. For example, the multiplexer MUXA[0] may provide data from the main array 11a (Main Array 1) to the data signal line DQ[0] responsive to the active Shift_Enable [0] signal. In a meanwhile, responsive to an active Shift_Enable [1] signal, MUXB[1] may provide data on the data signal line DQ[0] to the main array 11a (Main Array 1). Thus, the data from/to DQ[0] is redirected to/from the main array 11a (Main Array 1).

For example, Shift_Enable [5] signal may be provided to the multiplexer MUXA[5] 121 and the multiplexer MUXB [5] 122. If the Shift_Enable [5,6] signals are not active (e.g., a logic low level), which is indicative that the main arrays 11a (Main Arrays 5, 6, 7) are in use, a multiplexer MUXA[5] 121 and a multiplexer MUXB[6] 122 may couple the main array 11a (Main Array 5) to a data signal line DQ[5]. The multiplexer MUXA[5] 121 and the multiplexer MUXB[6] 122 may decouple the main array 11a (Main Array 5) from the data signal line DQ[5], if the Shift_Enable [5, 6] signals are active (e.g., a logic high level), which is indicative that one of the main arrays 11a (one of Main Arrays 5, 6, 7) has been disabled due to block error. In this case, the data from/to the data signal line DQ[5] may not be coupled to the main array 11a (Main Array 5), and instead, the data from/to DQ[5] may be redirected to an adjacent main array 11a (Main Array 4) instead of the ECC Parity/redundancy array 11b. For example, the multiplexer MUXA[5] may provide data from the main array 11a (Main Array 4) to the data signal line DQ[5] responsive to the active Shift_Enable [0] signal. In a meanwhile, responsive to an active Shift_Enable [5] signal, MUXB[5] may provide data on the data signal line DQ[5] to the main array 11a (Main Array 4). Thus, the data from/to DQ[5] is redirected to the main array 11a (Main Array 4). The above description is merely an example.

Thus, each of the plurality of multiplexers MUXA 121 may selectively couple one of the adjacent arrays, among the main arrays 11a and the redundancy arrays 11b, to one data signal line, and each of the plurality of multiplexers MUXB 122 may selectively couple one of the adjacent data signal lines to one array of the main arrays 11a and the redundancy arrays 11b, responsive to corresponding shift enable signals Shift_Enable[8:0]. Furthermore, the remapping circuit 110 may be merely an example. For example, any set of multiplexers or switches may be used as the remapping circuit 110 to selectively couple one of the adjacent arrays of the main arrays 11a and the redundancy arrays 11b. For example, changing addressing in a row decoder 12a that may redirect data to an adjacent array of an original destination array may be applied.

Figure 5:
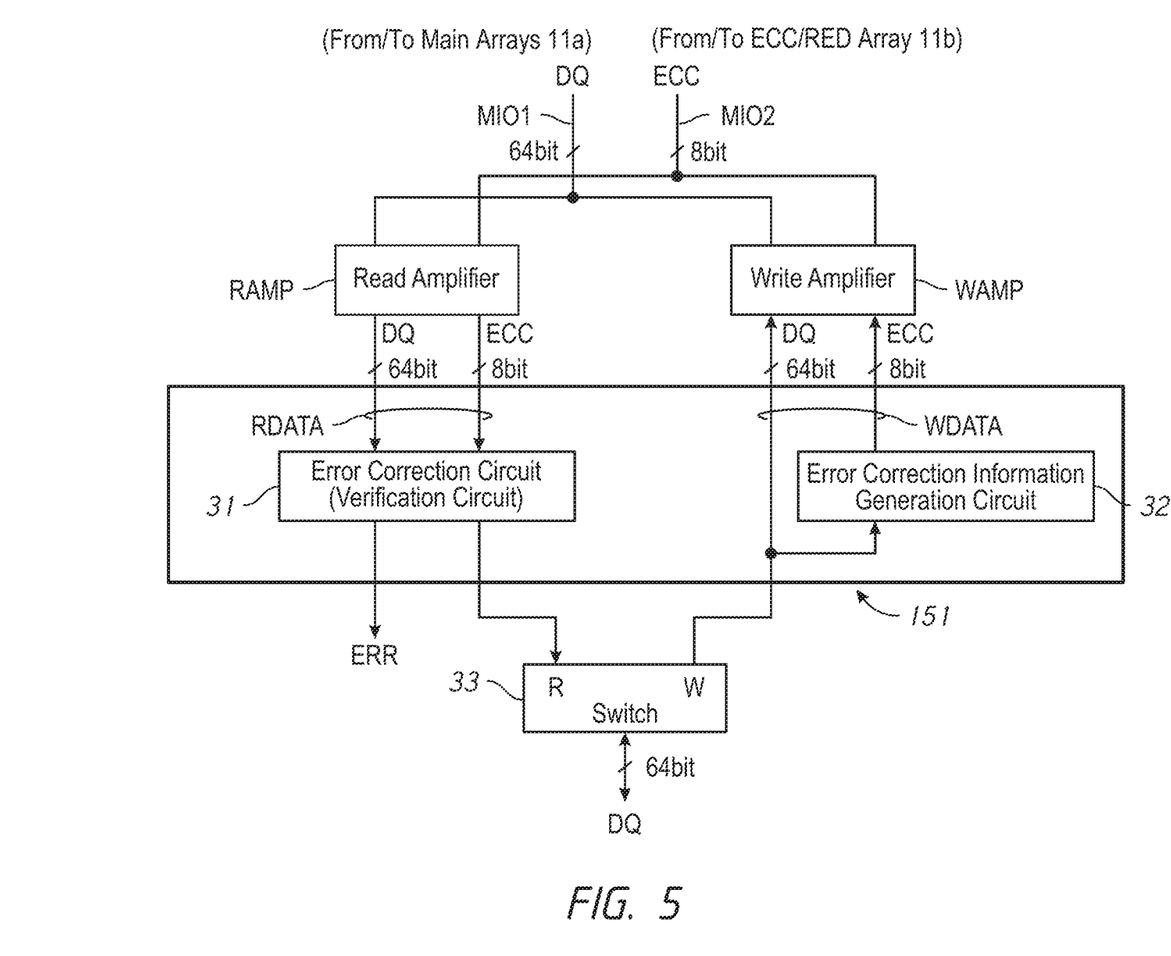
FIG. 5 is a block diagram of an error correction block in a semiconductor memory device according to an embodiment of the present disclosure.

FIG. 5 is a block diagram of an error correction block 151 in a semiconductor memory device according to an embodiment of the present disclosure. For example, the error correction block 151 may include an error correction information generation circuit 32. For example, the data from external terminals DQ may be provided to a switch 33 in the write operation. The switch 33 may provide the data from a write node W to a write amplifier WAMP and to the error correction information generation circuit 32. For example, the error correction information generation circuit 32 may generate error correction information ECC, (e.g., parity, syndrome, etc.), based on the data DQ, and provide the error correction information ECC to the write amplifier WAMP. The write amplifier WAMP may receive write data WDATA including the data DQ from the switch 33 and the error correction information ECC from the error correction information generation circuit 32, and provide the data DQ and the error correction information ECC to the main arrays 11$a$ and the ECC Parity/redundancy array 11$b$ via main data lines MIO1 and main data lines MIO2, respectively. As a result, the data DQ may be stored in memory cells on the main arrays 11$a$ while the error correction information ECC may be stored in memory cells on the ECC Parity/redundancy array 11$b$.

The error correction block 151 may include an error correction circuit (verification circuit) 31. A read amplifier RAMP may retrieve the data and the error correction information ECC via the main data lines MIO1 and the main data lines MIO2, and provide read data RDATA including the data and the error correction information ECC to the error correction circuit 31. The error correction circuit 31 that may verify the data DQ retrieved from the memory cells on the main array 11$a$ based on the correction information ECC read out from the memory cell array 11$b$. If any error is detected in the verification process, the error correction circuit 31 may provide an error signal ERR. If a number of errors is within error correction capability of the error correction circuit 31, the error correction circuit 31 may correct the error in the data, and may provide the data to a read node R of the switch 33, without providing the error signal ERR. The switch 33 may provide the data to the external terminals DQ. For example, the switch 33 may be included in the data buffer 153. The switch may select the write node W in the write operation, and may select and the read node R in the read operation. Although not shown, the error correction information generation circuit 32 and the error correction circuit 31 may receive a control signal, such as a block repair enable signal EN from the selection fuses 90. The error correction information generation circuit 32 and the error correction circuit 31 may be enabled responsive to the inactive state of the block repair enable signal EN, whereas the error correction information generation circuit 32 and the error correction circuit 31 may be disabled responsive to the active state of the block repair enable signal EN.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
a plurality of data terminals;
at least one memory cell array that includes a plurality of memory cells;
an ECC/parity redundancy array that includes a plurality of memory cells; and
a redundancy circuit configured to communicate data with the data terminals and further configured to provide the data to the at least one memory cell array and the ECC/parity redundancy array and to receive the data from the at least one memory cell array and the ECC/parity redundancy array,
wherein the redundancy circuit is configured to provide a portion of the data received from the plurality of data terminals to the ECC/parity redundancy array and further configured to receive the portion of the data from the ECC/parity redundancy array and to provide the portion of the data responsive to a first state of a control signal,
wherein the redundancy circuit is configured to provide error correction information to the ECC/parity redundancy array and further configured to receive the error correction information from the ECC/parity redundancy array responsive to a second state of the control signal that is different from the first state of the control signal,
wherein the redundancy circuit comprises a block repair circuit configured to prevent an error in the data responsive to the first state of the control signal,
wherein the block repair circuit is configured to replace a plurality of defective memory cells in a block in a test mode, and further configured to activate a block repair if a number of the defective memory cells is beyond error correction capability of the redundancy circuit, and
wherein the block repair circuit further comprises a fuse circuit configured to provide the control signal.

2. An apparatus, comprising:
a plurality of data terminals;
at least one memory cell array that includes a plurality of memory cells;
an ECC/parity redundancy array that includes a plurality of memory cells; and
a redundancy circuit configured to communicate data with the data terminals and further configured to provide the data to the at least one memory cell array and the ECC/parity redundancy array and to receive the data from the at least one memory cell array and the ECC/parity redundancy array,
wherein the redundancy circuit is configured to provide a portion of the data received from the plurality of data terminals to the ECC/parity redundancy array and further configured to receive the portion of the data from the ECC/parity redundancy array and to provide the portion of the data responsive to a first state of a control signal,
wherein the redundancy circuit is configured to provide error correction information to the ECC/parity redundancy array and further configured to receive the error correction information from the ECC/parity redundancy array responsive to a second state of the control signal that is different from the first state of the control signal, wherein the redundancy circuit comprises an error correction block configured to provide error correction information based on the data from the data terminals and further configured to prevent an error in the data based on the error correction information responsive to the second state of the control signal, wherein the error correction block includes an error correction information generation circuit and an error correction circuit, wherein the error correction information generation circuit is configured to generate error correction information based on the data from the data terminals and further configured to provide the error correction information to the ECC/parity redundancy array, and wherein the error correction circuit is configured to receive the data from the at least one memory cell array and the error correction information from the ECC/parity redundancy array, and further configured to detect one or more errors in the data based on the error correction information.

3. The apparatus of claim 2, wherein the error correction circuit is configured to correct the one or more errors when a number of the one or more errors is within error correction capability of the error correction circuit, and wherein the error correction circuit is configured to provide an error signal when a number of the one or more errors is beyond error correction capability of the error correction circuit.

4. An apparatus comprising:
a data input/output circuit coupled between a plurality of data terminals and a plurality of data signal lines, configured to receive data from the plurality of data terminals and further configured to provide the data via the plurality of data signal lines;
at least one memory cell array that includes a plurality of memory cells; and
a redundancy circuit coupled to the data input/output circuit via the plurality of data signal lines, comprising:
a block repair circuit configured to redirect a first portion of the data from the data input/output circuit designated to a first block in a first array including a plurality of defective cells, among the at least one memory cell array, to a second block different from the first block in a second array, responsive to a control signal indicative of enabling the block repair circuit; and
an error correction block configured to correct an error in the data from the at least one memory cell array, responsive to the control signal indicative of not enabling the block repair circuit.

5. The apparatus of claim 4 wherein the block repair circuit is configured to be enabled responsive to the control signal when a number of defective cells exceeds an error correction capability of the error correction block.

6. The apparatus of claim 4 wherein the redundancy circuit further comprises a mapping circuit configured to remap data to and from the first array to the second array, the second array adjacent the first array.

7. The apparatus of claim 4 wherein the error correction block is configured to correct the error in the data retrieved from the at least one memory cell array based on error correction information stored in the second array.

8. The apparatus of claim 4 wherein the error correction block is further configured to generate error correction information for data from an input/output circuit, the error correction information to be stored in the second array and the data from the input/output circuit to be stored in the at least one memory cell array.

9. The apparatus of claim of claim 4 wherein the second array is disposed between the first array and a third array.

10. An apparatus, comprising:
a first memory cell array;
a second memory cell array;
a main amplifier coupled to the first and second memory cell arrays and configured to provide write data to the first or second memory cell array and to receive read data from the first or second memory cell array;
a data input/output circuit configured to receive write data and configured to provide read data; and
a redundancy circuit coupled to the main amplifier and the data input/output circuit and including an error correction block and a block repair circuit, the block repair circuit configured to redirect write data designated to a block in the first memory cell array to the second memory cell array when enabled, and the error correction block configured to detect and correct errors based on error correction information stored in the second memory cell array when the block repair circuit is disabled.

11. The apparatus of claim 10 wherein the block repair circuit comprises:
selection fuses configured to provide an enable signal and provide fuse signals indicative of dimensions of a block to be repaired; and
an error correction block configured to receive the enable signal perform verification of data from the first memory cell array and the error correction information from the second memory cell array during a read operation responsive to the enable signal indicative of disablement of the block repair circuit.

12. The apparatus of claim 11 wherein enable signal is programmed based on scope of repair.

13. The apparatus of claim 10 wherein the block repair circuit further comprises:
select circuitry configured to provide selection signals based on the fuse signals and enable signal;
a multiplexer configured to receive the selection signals and memory addresses and configured to provide at least a portion of the selection signals as compare signals;
bad address storage fuses including non-volatile elements configured to store bad addresses; and
a compare circuit configured to receive bad addresses and the compare signals and configured to compare the bad addresses and the compare signals and enable an access operation to the second memory cell array responsive to a match.

14. The apparatus of claim 13 wherein the multiplexer is configured to provide a number of most significant bits of a memory address based on a value provided by the selection signals.

15. The apparatus of claim 10 wherein the first memory cell array includes a plurality of main arrays and wherein the second memory cell array is disposed between a first main array and a second main array.

16. The apparatus of claim 15, further comprising a remapping circuit configured to provide data from a data terminal coupled to the data input/output circuit to a selected one of a plurality of main arrays, the selected one of the plurality of main arrays based on shift enable signals.

17. The apparatus of claim 16 wherein the remapping circuit comprises a plurality of multiplexers configured to provide the data from the data terminal to one of two main arrays of the plurality of main arrays based on the shift enable signals.

18. The apparatus of claim 10 wherein the error correction block comprises:
    an error correction information generation circuit configured to provide error correction information based on write data, the error correction information to be stored to the second memory cell array; and
    an error correction circuit configured to verify the data retrieved from the first memory cell array based on the correction information from the second memory cell array.

* * * * *